United States Patent
Shi et al.

(10) Patent No.: US 12,428,749 B2
(45) Date of Patent: Sep. 30, 2025

(54) TEMPLATE FOR GROWING A CRYSTAL OF A TWO-DIMENSIONAL MATERIAL

(71) Applicants: IMEC VZW, Leuven (BE); Katholieke Universiteit Leuven, Leuven (BE)

(72) Inventors: Yuanyuan Shi, Leuven (BE); Pierre Morin, Woluwe-Saint-Pierre (BE); Benjamin Groven, Kortessem (BE); Vladislav Voronenkov, Leuven (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 267 days.

(21) Appl. No.: 18/351,402

(22) Filed: Jul. 12, 2023

(65) Prior Publication Data

US 2024/0018686 A1 Jan. 18, 2024

(30) Foreign Application Priority Data

Jul. 13, 2022 (EP) .................................... 22184742

(51) Int. Cl.
*C30B 25/04* (2006.01)
*C30B 29/46* (2006.01)

(52) U.S. Cl.
CPC .............. *C30B 25/04* (2013.01); *C30B 29/46* (2013.01)

(58) Field of Classification Search
CPC .......... C30B 25/04; C30B 25/02; C30B 29/46
See application file for complete search history.

(56) References Cited

U.S. PATENT DOCUMENTS

| 2003/0054646 | A1 * | 3/2003 | Yotsuya .................. C30B 33/00 438/689 |
| 2017/0175258 | A1 | 6/2017 | Robinson et al. |
| 2020/0098564 | A1 | 3/2020 | Li et al. |
| 2021/0183650 | A1 | 6/2021 | Chiu et al. |
| 2021/0408227 | A1 | 12/2021 | O'Brien et al. |

FOREIGN PATENT DOCUMENTS

| EP | 2487793 A1 * | 8/2012 | ......... H01L 21/0337 |
| EP | 3 575 436 A1 | 12/2019 | |
| JP | 3803538 B2 * | 8/2006 | ............... C30B 7/00 |
| WO | WO 2018/005838 A1 | 1/2018 | |

(Continued)

OTHER PUBLICATIONS

Aljarb et al., "Ledge-directed epitaxy of continuously self-aligned single-crystalline nanoribbons of transition metal dichalcogenides," *Nature Materials*, vol. 19, Dec. 2020, pp. 1300-1306.

(Continued)

*Primary Examiner* — Robert M Kunemund
(74) *Attorney, Agent, or Firm* — Knobbe, Martens, Olson & Bear, LLP

(57) ABSTRACT

In one aspect, a template for growing a crystal of a two-dimensional material can include a flat surface for growing the crystal thereon, a first wall on the flat surface, and a second wall on the flat surface. The first and the second walls can meet at a corner to form an angle having an opening that is adapted to align with the crystal structure of the crystal with a tolerance of up to 5°. Each of the first and second walls can have a length of from 5 nm to 1000 nm and a height of from 0.6 nm to 2 nm.

22 Claims, 5 Drawing Sheets

(56) References Cited

FOREIGN PATENT DOCUMENTS

WO    WO 2022/058799 A1    3/2022

OTHER PUBLICATIONS

Chen et al., "Step-Edge-Guided Nucleation and Growth of Aligned WSe2 on Sapphire via a Layer-over-Layer Growth Mode," *ACS Nano*, vol. 9, No. 8, 2015, pp. 8368-8375.

Chiu et al., "Metal-Guided Selective Growth of 2D Materials: Demonstration of a Bottom-Up CMOS Inverter," *Adv. Mater.*, vol. 31, 2019, 1900861, pp. 1-8.

Chubarov et al., "Wafer-Scale Epitaxial Growth of Unidirectional WS2 Monolayers on Sapphire," *ACS Nano*, vol. 15, 2021, pp. 2532-2541.

Givargizov, E.I., "Graphoepitaxy as an approach to oriented crystallization on amorphous substrates," *Journal of Crystal Growth*, vol. 310, 2008, pp. 1686-1690.

Han et al., "Growth of 2H stacked WSe2 bilayers on sapphire," *Nanoscale Horiz.*, vol. 4, 2019, 1434-1442.

Hwang et al., "Hydrogen-assisted step-edge nucleation of MoSe2 monolayers on sapphire substrates," *Nanoscale*, vol. 11, 2019, pp. 7701-7709.

Katzenberg et al., "Two types of graphoepitaxy of tellurium onto uniaxially-oriented polyethylene," *Journal of Materials Science*, vol. 33, 1998, pp. 4787-4790.

Wong et al., "Recent progress in chemical vapor deposition growth of two-dimensional transition metal dichalcogenides," *Progress in Crystal Growth and Characterization of Materials*, Elsevier Publishing, vol. 62, No. 3, Jul. 28, 2016, pp. 9-28.

Extended European Search Report dated Dec. 22, 2022 in European Application No. 22184742.9 in 8 pages.

Choudhury et al., "Epitaxial Growth of 2D Layered Transition Metal Dichalcogenides," *Annual Review of Materials Research*, vol. 50, arXiv:1909.03502, 2020, 36 pages.

* cited by examiner

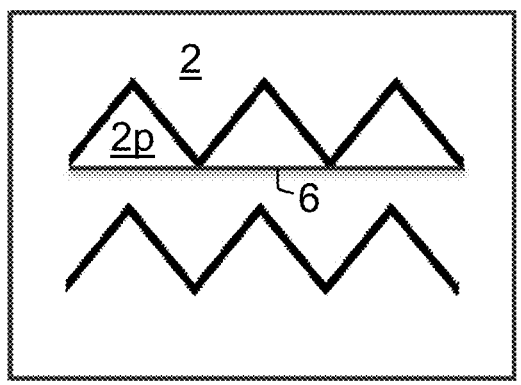
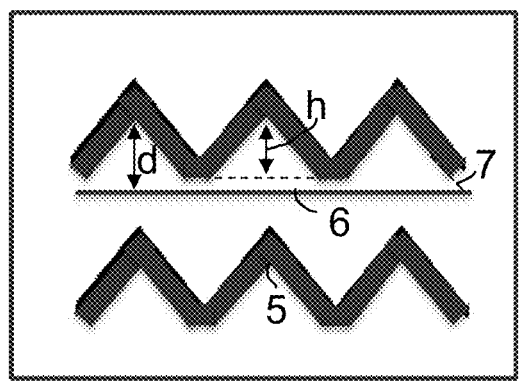
FIG. 4A      FIG. 4B
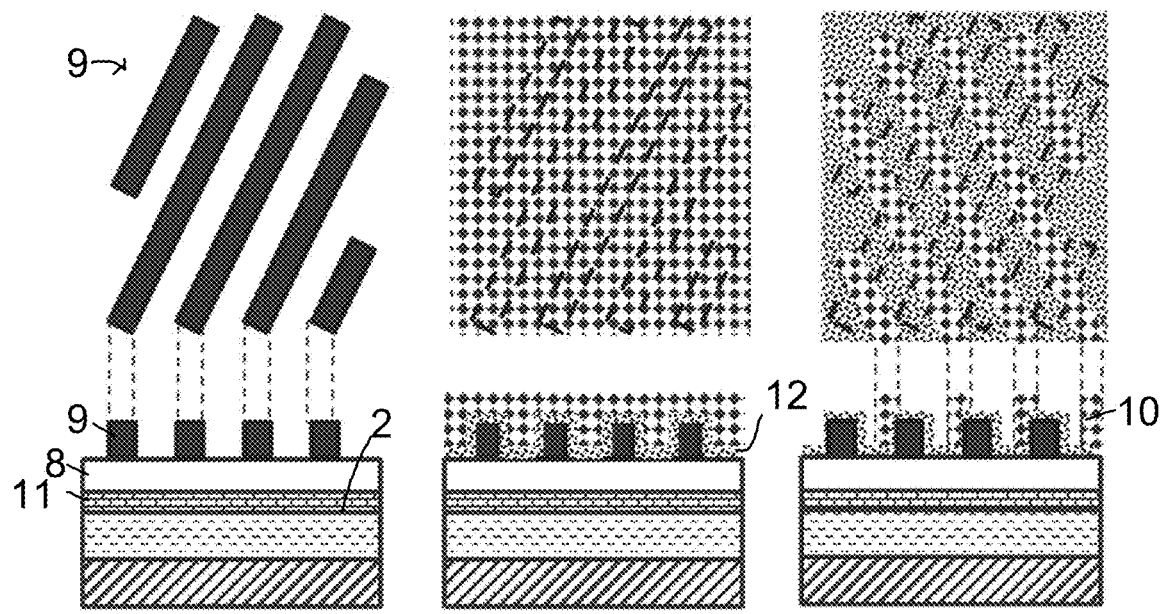
FIG. 5A      FIG. 5B      FIG. 5C
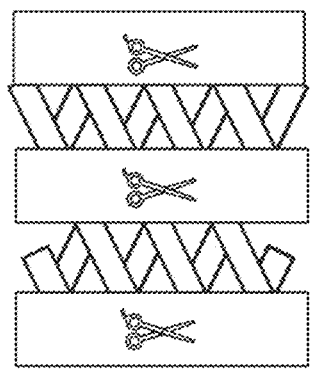
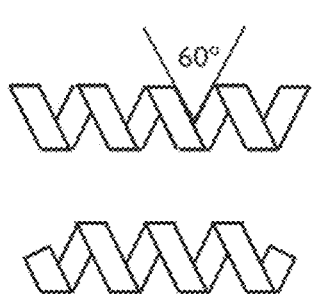
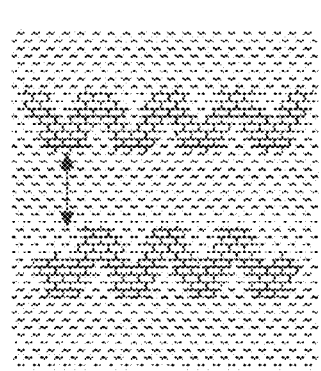
FIG. 5D      FIG. 5E      FIG. 5F FIG. 8A
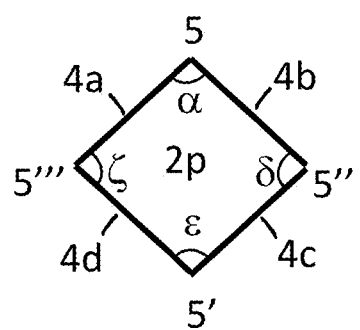
FIG. 8B
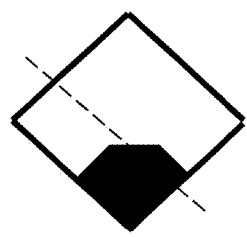
FIG. 8C
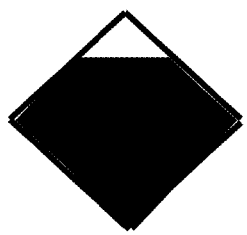
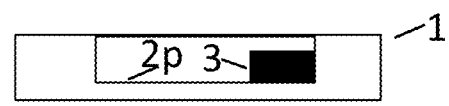
FIG. 8D

TEMPLATE FOR GROWING A CRYSTAL OF A TWO-DIMENSIONAL MATERIAL

CROSS-REFERENCE TO RELATED APPLICATIONS

This application claims foreign priority to European Patent Application EP 22184742.9, filed Jul. 13, 2022, the content of which is incorporated by reference herein in its entirety.

BACKGROUND

Technical Field

The disclosed technology relates to the field of two-dimensional material crystals, such as transition metal dichalcogenide crystals, for use as channel material in transistors, and more particularly to the deposition of such transition metal dichalcogenide crystals.

Description of the Related Technology

New computing-intensive applications such as Internet of Things (IoT) and artificial intelligence (AI), require extreme energy efficiency and a concomitant improvement of cost performance of the electronic systems. Modern computer processors are built on field-effect transistors (FETs). Since the 1960s, the number of transistors in a typical microprocessor has followed an exponential growth, a trend known as Moore's law. More transistors are integrated in a single chip with much improved performance and reduced cost, by making the transistor smaller. However, as silicon transistors enter the sub-10 nm technology node, channel performance drastically reduces, limiting further device scaling. Therefore, it becomes increasingly important to explore alternative device geometries or new channel materials. Atomically thin two-dimensional (two-dimensional) semiconductors have attracted tremendous interest as a new channel material that could facilitate continued transistor scaling. To benefit from continuous scaling, the performance of the scaled two-dimensional transistors needs to outperform silicon technology at similar device dimensions. In theory, transition metal dichalcogenides ($MX_2$, where M and X stand for a transition metal and a chalcogen respectively) is a family of materials that could succeed in this task. However, the deposition of $MX_2$ crystals with control over the crystalline structure, morphology and material properties remains a challenge.

There is therefore a need in the art for new methods and systems overcoming at least partially this issue.

SUMMARY OF CERTAIN INVENTIVE ASPECTS

It is an object of the disclosed technology to provide functional templates for depositing a crystal of a two-dimensional material, and methods of fabricating the template.

In a first aspect, the disclosed technology relates to a template for growing a crystal of a two-dimensional material, including:
a. a flat surface for growing the crystal of the two-dimensional material thereon,
b. a first wall on the flat surface, and
c. a second wall on the flat surface,
wherein the first and the second walls meet at a corner to form an angle (a) having an opening that is adapted to align with the crystal structure of the crystal with a tolerance of up to 5°, wherein each of the first and second walls has a length of from 5 nm to 1000 nm and a height of from 0.6 nm to 10 nm.

In some examples, in the first aspect, the disclosed technology relates to a template for growing a crystal of a two-dimensional material, including:
a. a flat surface for growing the crystal of the two-dimensional material thereon,
b. a first wall on the flat surface, and
c. a second wall on the flat surface,
wherein the first and the second walls meet at a corner to form an angle (a) having an opening that is adapted to align with the crystal structure of the crystal with a tolerance of up to 5°, wherein each of the first and second wall has a length of from 5 nm to 1000 nm and a height of from 0.6 nm to 2 nm. This can be advantageous as it limits and typically prevents the growth of the two-dimensional material vertically on the walls more efficiently than if the height is higher than 2 nm.

In embodiments, the template may further include a third wall on the flat surface, the third wall facing the opening and forming an angle ($\beta$, $\gamma$) with each of the first and second wall or with extensions of each of the first and second walls, wherein the shortest distance between the corner and the third wall is at most 1000 nm, wherein the length of the third wall is at least equal to the length of the longest of the first wall and the second wall, and wherein the height of the third wall is from 0.6 nm to 2 nm.

In embodiments, each of the angles ($\alpha$, $\beta$, $\gamma$) may be from 55° to 65°, preferably from 59° to 61°, and is most preferably equal to 60°.

For instance, in an embodiment of the first aspect, the disclosed technology may relate to a template for growing a transition metal dichalcogenide crystal, including:
a. a flat surface for growing the transition metal dichalcogenide crystal thereon,
b. a first wall on the flat surface, and
c. a second wall on the flat surface,
wherein the first and the second walls meet at a corner to form an angle ($\alpha$) having an opening of from 55 to 65°, wherein each of the first and second walls has a length of from 5 nm to 1000 nm and a height of from 0.6 nm to 2 nm.

For instance, in these embodiments where the angle ($\alpha$) has an opening of from 55° to 65°, the template may further include a third wall on the flat surface, the third wall facing the opening and forming an angle ($\beta$, $\gamma$) of from 55 to 650 with each of the first and second wall or with extensions of each of the first and second walls, wherein the shortest distance between the corner and the third wall is at most 1000 nm, wherein the length (L) of the third wall is at least equal to the length of the longest of the first wall and the second wall, and wherein the height of the third wall is from 0.6 nm to 2 nm.

In embodiments, the angle ($\alpha$) may be from 85° to 95°, preferably from 89° to 91°, and is most preferably equal to 90°, and wherein each of the angles $\beta$, and $\gamma$ is from 42° to 48°, preferably from 44° to 46°, and is most preferably equal to 45°.

In embodiments, the first, second, and third walls may form a triangle. For instance, this can be the case if the angle ($\alpha$) is from 550 to 650 or if the angle ($\alpha$) is from 85 to 950.

In embodiments, the template may include a series of the first walls parallel to each other and a series of the second walls parallel to each other. For instance, this can be the case if the angle (α) is from 55° to 65° or if the angle (α) is from 85 to 95°.

In embodiments, the template may further include a third wall, and a fourth wall on the flat surface, wherein the third and the fourth walls meet at a further corner to form an angle (e) having an opening that is adapted to align with the crystal structure of the crystal with a tolerance of up to 5°, wherein the opening of the further corner faces the opening of the corner, wherein the third wall is parallel to the first wall, wherein the fourth wall is parallel to the second wall, wherein the shortest distance between the first wall and the third wall and the shortest distance between the second wall and the fourth wall is at most 1000 nm, and wherein the length of the third wall and the length of the fourth wall is equal to the length of the first wall and the length of the second wall respectively. In these embodiments, the template may include a series of first walls parallel to each other, a series of the second walls parallel to each other, a series of third walls parallel to each other and a series of fourth walls parallel to each other.

In embodiments, the template may include a series of the first walls parallel to each other and a series of the second walls parallel to each other. For instance, this can be the case if the angle (α) is from 550 to 650 or if the angle (α) is from 85 to 95°. An example thereof advantageous when (α) is from 85 to 950 is when the template includes a series of first walls parallel to each other, a series of the second walls parallel to each other, a series of third walls parallel to each other and a series of fourth walls parallel to each other.

In embodiments when the template further includes a third wall, and a fourth wall on the flat surface, wherein the third and the fourth walls meet at a further corner to form an angle (e), the first, the second, the third, and the fourth walls may form a square.

In embodiments, the flat surface may be amorphous. For instance, this can be the case if the angle (α) is from 550 to 650 or if the angle (α) is from 85 to 95°.

In embodiments, the height of each wall may be from 1 nm to 2 nm. For instance, this can be the case if the angle (α) is from 550 to 650 or if the angle (α) is from 85 to 950.

In embodiments, the walls may be made of a crystalline material having a lattice constant within one percent of the lattice constant of the crystal of two-dimensional material. For instance, this can be the case if the angle (α) is from 55° to 65° or if the angle (α) is from 85 to 95°.

In embodiments, the material of the walls can be etched selectively with respect to the material of the flat surface. For instance, this can be the case if the angle (α) is from 55° to 65° or if the angle (α) is from 85 to 95°.

In embodiments, the corner may have a radius of curvature (R) of at most 5 nm, preferably at most 1 nm. For instance, this can be the case if the angle (α) is from 550 to 650 or if the angle (α) is from 85 to 95°.

In embodiments, the flat surface and the walls may be made of different materials.

In embodiments, the material of the walls may be made of one or more layers of a two-dimensional material. For instance, this can be the case if the angle (α) is from 55° to 65° or if the angle (α) is from 85 to 95°.

In embodiments, the template may further include a crystal of a two-dimensional material in physical contact with the flat surface, the first wall (4a), and the second wall. For instance, this can be the case if the angle (α) is from 55° to 65° or if the angle (α) is from 85 to 95°. For instance, if the angle (α) is from 55° to 65°, the template may further include a transition metal dichalcogenide crystal (3) in physical contact with the flat surface (2), the first wall (4a), and the second wall (4b).

In a second aspect, the disclosed technology relates to a method of forming a template according to the first aspect, including:
 a. providing a layer stack including:
  i. a flat surface for growing a two-dimensional material crystal thereon,
  ii. a wall material layer on the flat surface,
  iii. a hard mask layer over the wall material layer,
  iv. a first set of parallel lines separated by a distance of from 5 nm to 1000 nm, the first set being above a top surface of the hard mask layer, being parallel thereto, and having a first orientation, and
  v. a second set of parallel lines separated by a distance of from 5 nm to 1000 nm, the second set being above the top surface of the hard mask layer, being parallel thereto, and having a second orientation forming an angle with the first orientation that is adapted to align with the crystal structure of the two-dimensional material crystal with a tolerance of up to 5°,
 b. etching the hard mask layer anisotropically and perpendicularly to the top surface of the hard mask layer by using the first and the second set of parallel lines as masks, thereby forming a hard mask pattern, and
 c. etching the wall material layer anisotropically and perpendicularly to the top surface of the wall material layer by using the hard mask pattern as a mask, thereby forming the template.

As an example, an embodiment of the first aspect may relate to a method of forming a template, including:
 a. providing a layer stack including:
  i. a flat surface for growing a transition metal dichalcogenide crystal thereon,
  ii. a wall material layer on the flat surface,
  iii. a hard mask layer over the wall material layer,
  iv. a first set of parallel lines separated by a distance of from 5 nm to 1000 nm, the first set being above a top surface of the hard mask layer, being parallel thereto, and having a first orientation, and
  v. a second set of parallel lines separated by a distance of from 5 nm to 1000 nm, the second set being above the top surface of the hard mask layer, being parallel thereto, and having a second orientation forming an angle (α) of from 550 to 650 with the first orientation,
 b. etching the hard mask layer anisotropically and perpendicularly to the top surface of the hard mask layer by using the first and the second set of parallel lines as masks, thereby forming a hard mask pattern, and
 c. etching the wall material layer anisotropically and perpendicularly to the top surface of the wall material layer by using the hard mask pattern as a mask, thereby forming the template.

In a third aspect, the disclosed technology relates to a process of growing a layer of a two-dimensional crystalline material including a) providing a template according to any embodiment of the first aspect, and b) growing the layer of the two-dimensional crystalline material within the template.

In an embodiment of the third aspect, the disclosed technology may relate to a process for growing an $MX_2$ material including a) providing a template according to any embodiment of the first aspect, and b) growing the $MX_2$ material within the template.

In a fourth aspect, the disclosed technology relates to the use of a template according to the first aspect to grow a crystal of a two-dimensional material.

In an embodiment of the fourth aspect, the disclosed technology relates to the use of a template according to the first aspect to grow an $MX_2$ crystal.

It is an advantage of embodiments of the disclosed technology that monocrystalline crystals can be formed.

It is an advantage of embodiments of the disclosed technology that crystals having a low areal density of grain boundaries can be formed, and in particular having a low areal density of inversion domain boundaries.

It is an advantage of embodiments of the disclosed technology that crystals having a unidirectional in-plane orientation can be formed.

It is an advantage of embodiments of the disclosed technology that crystals comprised of a single monolayer can be formed.

It is an advantage of embodiments of the disclosed technology that it allows controlling the seeding and orientation of the crystals during nucleation. Thus, even when more than one crystal is formed in the template, they tend to be unidirectional so that when they coalesce to form a continuous monolayer, a single crystalline monolayer can typically be obtained.

It is an advantage of embodiments of the disclosed technology that high-quality crystals can be formed, for example, having a low intragrain defectivity.

It is an advantage of embodiments of the disclosed technology that large monocrystal sizes can be achieved.

It is an advantage of embodiments of the disclosed technology that the precise location of a high quality crystal on a substrate can be set, thereby enabling the fabrication of a device at that precise location, thereby reducing and/or avoiding defects, such as grain boundaries, within the active area of the device.

Aspects of the disclosed technology are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, embodiments of the disclosed technology are believed to represent substantial new and novel improvements, including departures from prior practices, resulting in the provision of more efficient, stable, and reliable devices of this nature.

The above and other characteristics, features, and advantages of the disclosed technology will become apparent from the following detailed description, taken in conjunction with the accompanying drawings, which illustrate, by way of example, the principles of the disclosed technology. This description is given for the sake of example only, without limiting the scope of the disclosed technology. The reference figures quoted below refer to the attached drawings.

BRIEF DESCRIPTION OF THE DRAWINGS

FIGS. 4A and 4B are schematic representations of top views of templates according to embodiments of the first aspect of the disclosed technology.

FIGS. 5A, 5B, 5C, 5D, 5E, and 5F show intermediate structures in a method according to the second aspect of the disclosed technology.

FIGS. 8A, 8B, and 8C are schematic representations of a top view of a template according to an embodiment of the first aspect in which a crystal is seeding and growing.

FIG. 8D shows a schematic representation of a side view of a vertical cross-section through the dashed line in FIG. 8B.

Figure 1A:
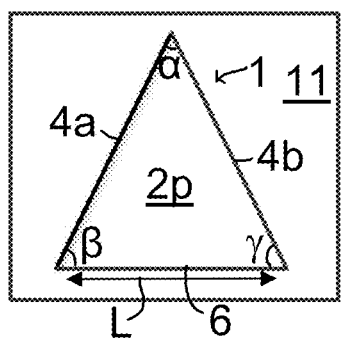
FIGS. 1A, 1B, and 1C are schematic representations of a top view of a template according to an embodiment of the first aspect in which a crystal is seeding and growing.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings, but the disclosed technology is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosed technology.

Furthermore, the terms first, second, third, and the like in the description and in the claims, are used for distinguishing between similar elements and not necessarily for describing a sequence, either temporally, spatially, in ranking, or in any other manner. It is to be understood that the terms so used can be interchangeable under appropriate circumstances and that the embodiments of the disclosed technology described herein are capable of operation in other sequences than described or illustrated herein.

Moreover, the terms top, bottom, over, under and the like in the description and the claims are used for descriptive purposes and not necessarily for describing relative positions. It is to be understood that the terms so used can be interchangeable under appropriate circumstances and that the embodiments of the disclosed technology described herein are capable of operation in other orientations than described or illustrated herein.

The terms "over" and "above" can be used as synonyms and cover situations with and without physical contacts. The term "on" can refer to "over and in physical contact with".

It is to be noticed that the term "comprising", used in the claims, should not be interpreted as being restricted to the elements listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. The term "comprising" therefore covers the situation where only the stated features are present (and can therefore be replaced by "consisting of" in order to restrict the scope to the stated features) and the situation where these features and one or more other features are present. The word "comprising" according to the disclosed technology therefore also includes as one embodiment that no further components are present. Thus, the scope of the expression "a device comprising A and B" should not be interpreted as being limited to devices consisting only of components A and B. It means that with respect to the disclosed technology, the only relevant components of the device are A and B.

Reference throughout this specification to "one embodiment" or "an embodiment" means that a particular feature, structure, or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed technology requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some, but not other features included in other embodiments, combinations of features of different embodiments are meant to be within the scope of the disclosed technology, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosed technology.

In the description provided herein, numerous specific details are set forth. However, it is understood that embodiments of the disclosed technology may be practiced without these specific details. In some instances, methods, structures, and techniques have not been shown in detail in order not to obscure an understanding of this description.

In the context of the disclosed technology, when reference is made to a crystal structure of a material or crystal, the ordered arrangement of atoms, ions, or molecules in the material or crystal is meant. The arrangement may be independent of the type of atoms, ions, or molecules: for example, both graphene and boron nitride may have a hexagonal crystal structure and, thus, may have the same crystal structure, even though the atoms or ions making up these materials are different. When referring to a particular crystal structure of a crystal, reference may be made to the corresponding Bravais lattices, which are grouped into four corresponding lattice systems. For example, when referring to an orthorhombic crystal structure, reference is made to the orthorhombic lattice system, including the rectangular and centered rectangular Bravais lattices. An angle adapted to align with this crystal structure is 90°. For example, when referring to a monoclinic crystal structure, reference is made to the monoclinic lattice system including the oblique Bravais lattice. An angle adapted to align with this crystal structure is 90°. For example, when referring to a tetragonal crystal structure, reference is made to the tetragonal lattice system including the square Bravais lattice. An angle adapted to align with this crystal structure is 90°. For example, when referring to a hexagonal crystal structure, reference is made to the hexagonal lattice system including the hexagonal Bravais lattice. An angle adapted to align with this crystal structure is 60°.

We now refer to FIGS. 1A-1C and 2A. In a first aspect, the disclosed technology relates to a template (1) for growing a crystal (3) of a two-dimensional material, including:
  a. a flat surface (2) for growing the crystal (3) of the two-dimensional material thereon,
  b. a first wall (4a) on the flat surface (2), and
  c. a second wall (4b) on the flat surface (2),
  wherein the first and the second walls (4a, 4b) meet at a corner (5) to form an angle ($\alpha$) having an opening that is adapted to align with the crystal structure of the crystal (3) with a tolerance of up to 5°, wherein each of the first and second walls (4a, 4b) has a length of from 5 nm to 1000 nm and a height of from 0.6 nm to 2 nm.

Without being bound by theory, it is believed that the opening of the angle of the corner being adapted to align with the crystal structure of the crystal with a tolerance of up to 5°, can induce the growth of the crystal in that corner and/or can induce the seamless coalescence of crystals growing on a same wall or on different walls forming the opening. This means that the angle of the corner can be within a tolerance of up to 5°, and is preferably equal, to the particular angle formed by the intersection of the in-plane axes of the particular crystalline system of the crystal of the two-dimensional material (or, in other words, to the crystal angle between edges of the unit cell of the two-dimensional material).

As an example, when the angle ($\alpha$) has an opening from 55° to 65°, the template (1) of the first aspect favors the growth of, for example, a monocrystalline $MX_2$ layer, for example, of a single $MX_2$ crystal (3), therein. It is believed that since $MX_2$ crystals (3) have a hexagonal symmetry characterized by angles of 60° at the intersections of the three in-plane axes of the hexagonal crystalline system (or, in other words, of 60° between the edges of the unit cell of the two-dimensional material), the fact that the angle ($\alpha$) at the corner (5) is close to 60° can induce the growth of the crystal (3) in that corner (5) and/or can induce the seamless coalescence of crystals growing on a same wall or on different walls.

As another example, when the angle ($\alpha$) has an opening from 85 to 95°, the growth of other monocrystalline layers can be favoured, that is, single crystals that have a cubic symmetry, tetragonal symmetry, orthorhombic symmetry (for example, Tin monosulfide SnS, p-type semiconductor) or monoclinic symmetry (for example, titanium trisulfide $TiS_3$, tantalum trisulfide $TaS_3$— all semiconductors; vanadium oxide $V_2O_5$, van der Waals oxide) characterized by angles of 90° at the intersection of at least one set of two in-plane axes of the crystalline system (or, in other words, by angles of 90° between edges of the unit cell of the two-dimensional material). In that case it is believed that the fact that the angle ($\alpha$) at the corner (5) is close to 90° can induce the growth of the crystal (3) in that corner (5) and/or can induce the seamless coalescence of crystals growing on a same wall or on different walls.

Also, it is believed that by keeping the walls (4a, 4b) short, the atoms contacting the surface between the walls (4a, 4b) find themselves frequently at a shorter distance from a wall (4a, 4b) than their diffusion length, which can favor the nucleation and ripening of few or even of only one nucleus. For longer walls (4a, 4b), it can become increasingly likely that the layer formed between the walls (4a, 4b) will be polycrystalline. The layer is for example an $MX_2$ layer or for example a $TiS_3$ layer. Also, it is believed that by keeping the walls (4a, 4b) low, the growth of a crystal (3) vertically, for example parallel to and on a wall (4a, 4b) can be reduced and/or prevented.

Figure 2A:
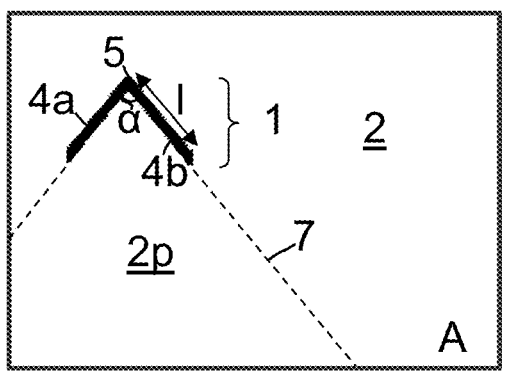
FIGS. 2A and 2B show schematic representations of top views of templates according to embodiments of the disclosed technology.

In FIG. 2A, the template (1) includes a flat surface (2) and at least two walls (4a, 4b). The walls (4a, 4b) stand perpendicular to the flat surface (2).

In embodiments, the angle ($\alpha$) between the first wall and the second wall is from 55° to 65° and the crystal has a hexagonal crystal structure.

In different embodiments, the angle ($\alpha$) between the first wall and the second wall is from 85° to 95° and the crystal has a cubic crystal structure, an orthorhombic crystal structure, a tetragonal crystal structure, or a monoclinic crystal structure. In embodiments wherein the crystal has an orthorhombic crystal structure, the material may be tin monosulfide.

In different embodiments, the crystal has a monoclinic crystal structure, that may be described by a lattice structure containing a crystal angle between edges of the unit cell of the monoclinic crystal structure, wherein the angle ($\alpha$) between the first wall and the second wall is equal to the crystal angle with a tolerance of up to 5°. In embodiments wherein the crystal has a monoclinic crystal structure, the crystal may be titanium trisulfide or tantalum trisulfide, which are semiconductors, or vanadium oxide $V_2O_5$, or a van der Waals oxide.

In all embodiments, the tolerance is preferably up to 4°, more preferably up to 3°, even more preferably up to 2°, still more preferably up to 10, most preferably 0°.

Figure 2B:
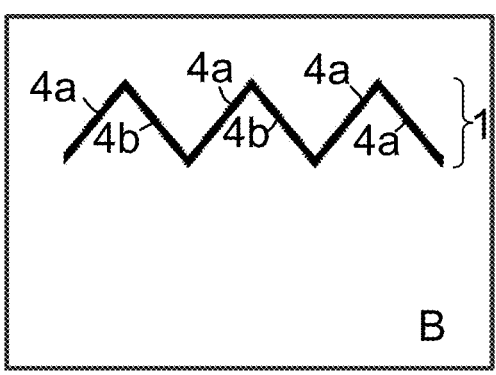
Figure 3A:
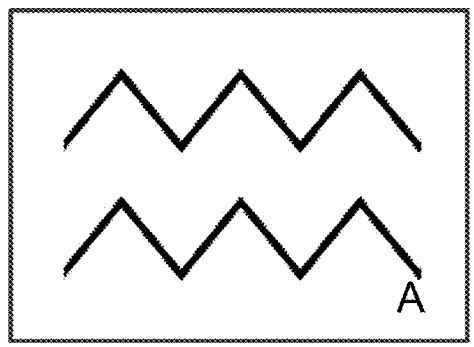
FIGS. 3A and 3B show schematic representations of top views of a template according to an embodiment of the first aspect in which crystals are growing and overlapping.
Figure 3B:
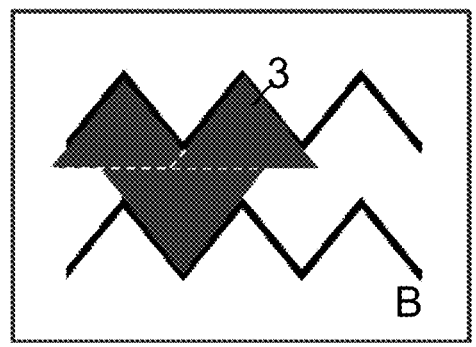

We now refer to FIGS. 2B, 3A, and 3B.

In embodiments, the template (1) may include a series of the first walls (4a) parallel to each other and a series of the second walls (4b) parallel to each other. Such embodiments can have the advantage of providing a plurality of corners (5) from which crystals can grow. A disadvantage of the possibility of having more than one corner (5), and hence more than one crystal (3) growing in the template (1) can be that some of these crystals (3) may overlap with each other. In view of the typical orientation of such crystals (3), this typically only leads to defects that can be attenuated or erased by annealing.

We now refer to FIG. 2B. In embodiments, the two series of walls may form a chain of first walls (4a) alternating with second walls (4b). Such embodiments have the advantage of providing at least three corners (5) from which crystals (3) can grow.

We now refer to FIG. 3A. In embodiments, the two series of walls may form at least a first and a second chain of first walls (4a) alternating with second walls (4b) wherein at least a first wall (4a) of the first chain is coplanar with a first wall (4a) of the second chain and wherein a second wall (4b) of the first chain is coplanar with a second wall (4b) of the second chain. Such embodiments can have the advantage of providing a plurality of corners (5) from which crystals (3) can grow. A disadvantage of the possibility of having more than one corner (5), and hence more than one crystal (3) growing in the template (1) can be that some of these crystals (3) may overlap with each other (see FIG. 3B). In view of the typical orientation of such crystals (3), this typically only lead to defects that can be attenuated or erased by annealing.

We now refer to FIGS. 1A-1D and 4A-4B.

In embodiments, the template (1) includes a third wall (6) in physical contact with the flat surface, the third wall facing the corner (5), that is, the corner of the first and second walls (4a, 4b), wherein the shortest distance between the corner (5) and the third wall (6) is at most 1000 nm, and wherein the length of the third wall (6) is at least equal to the length of the longest of the first wall and the second wall. In preferred embodiments, the walls of the template form an enclosure.

In some embodiments, when the angle ($\alpha$) between the first and the second walls (4a, 4b) has an opening from 55° to 65°, the third wall (6) faces the opening and respectively forms an angle ($\beta$, $\gamma$) of from 550 to 650 with each of the first and second wall (4a, 4b) or with extensions (7) of each of the first and second walls (4a, 4b), wherein the shortest distance between the corner (5) and the third wall (6) is at most 1000 nm, wherein the length of the third wall (6) is at least equal to the length of the first wall (4a) or the second wall (4b), and wherein the height of the third wall (6) is from 0.6 nm to 2 nm. In other embodiments, when the angle ($\alpha$) between the first and the second walls (4a, 4b) has an opening from 85° to 95°, the third wall (6) faces the opening and respectively forms an angle ($\beta$, $\gamma$) of from 400 to 500 with each of the first and second walls (4a, 4b) or with extensions (7) of each of the first and second walls (4a, 4b).

The presence of the third wall (6) creates a complete (FIGS. 1A-1C, 4A) or partial (FIG. 4B) enclosure. Within that enclosure, atoms are frequently within their diffusion length of the walls. It also permits control of the size of the crystal (3).

The presence of the third wall (6) can be particularly advantageous when the template (1) includes a series of the first walls (4a) parallel to each other and a series of the second walls (4b) parallel to each other.

Figure 1B:
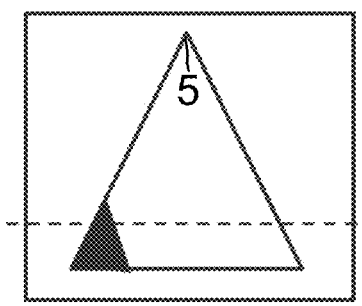
Figure 1C:
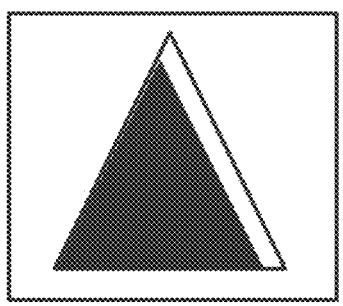

We now refer to FIGS. 1A-1C.

In embodiments, the first, second, and third walls (4a, 4b, 6) form a triangle. In embodiments wherein the third wall (6) is physically connected to the first wall (4a) and the second wall (4b) to form a triangle, a portion (2p) of the flat surface (2) can be entirely delimited by the first, second and third wall (4a, 4b, 6). This portion (2p) forms an enclosure within which atoms are frequently within their diffusion length of the walls. It also permits control of the size of the crystal (3). Furthermore, it provides two additional corners (5) from which the crystal (3) can grow, enabling a faster growth. In FIGS. 1A-1C, the part of the surface (2) outside of the portion (2p) is hidden from view by the wall material layer (11) because this wall is thick. For thinner walls, the part of the surface (2) outside of the portion (2p) would be visible, as in FIGS. 2A-2B. The thickness of the walls is not important, only the height is important. A disadvantage of the possibility of having more than one crystal (3) growing in the template (1) can be that these crystals (3) may overlap.

In view of the typical orientation of such crystals (3), this typically only lead to defects that can be attenuated or erased by annealing.

Figure 1D:
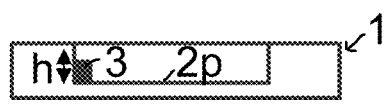
FIG. 1D shows a schematic representation of a side view of a vertical cross-section through the dashed line in FIG. 1B.

FIGS. 1A-1C are schematic representations of top views of a template according to an embodiment of the first aspect. FIG. 1A shows the template before the formation of an $MX_2$ nucleus. FIG. 1B shows an $MX_2$ growing in a corner (5). FIG. 1C shows the same $MX_2$ nucleus after it has grown to almost its final size. FIG. 1D shows the schematic representation of a side view of a cut through the dashed line in FIG. 1B.

As mentioned earlier, the presence of the third wall (6) can be particularly advantageous when the template (1) includes a series of the first walls (4a) parallel to each other and a series of the second walls (4b) parallel to each other. This situation is depicted in FIGS. 4A and 4B.

As seen in relation to FIG. 3B, a disadvantage of having a series of the first walls (4a) parallel to each other and a series of the second walls (4b) parallel to each other can be that some of the crystals (3) growing in such a template (1) may overlap with each other. This is, for instance, the case when the two series of walls form a chain of first walls (4a) alternating with second walls (4b). In that case, the growing crystals (3) may overlap laterally. To avoid this in some embodiments, a third wall (6) can be present that is physically connected to all first walls (4a) and all second walls (4b) of the chain, thereby forming triangles. This can prevent crystals (3) of the chain formed of triangles from overlapping with each other. If at least a second chain is present, as in FIGS. 3A-3B and FIGS. 4A-4B, this can also prevent crystals (3) growing on one chain to overlap with crystals (3) growing on another chain in some embodiments.

We now refer to FIG. 4B.

In embodiments, the shortest distance between the corner (5) and the third wall (6) is larger than the height (h) of a triangle formed on the flat surface (2) by the corner (5), an extremity of the first wall (4a) away from the corner (5), and an extremity of the second wall (4b) away from the corner (5), the height (h) being measured perpendicularly to the third wall (6). In such embodiments, a portion (2p) of the flat surface (2) is partly delimited by the first and second walls (4a, 4b) and by the third wall (6) facing the opening. It is further delimited by extensions (7) of each of the first and second wall (4b). In such embodiments, a portion (2p) of the flat surface (2) can be entirely delimited by the first and second walls (4a, 4b), their extensions (7), and by the third wall (6) facing the opening and intersecting the extensions (7). The extensions (7) are not solid objects but are virtual. In other words, an extension (7) of a wall (4a, 4b, 6) can refer to a part of space that would be occupied by the wall (4a, 4b, 6) if the wall (4a, 4b, 6) was longer than it is.

In various embodiments where the third wall (6) is present, the shortest distance between the corner (5) and the third wall (6) is preferably at most 1000 nm. When this is the case, the diffusion length of the atoms during the nucleation and ripening of the crystal (3) can typically be made longer than this distance. In some such embodiments, typically, only one crystal (3) will grow in the space delimited by the three walls and the extensions (7) of the first and second walls (4b).

Preferably in some embodiments, the shortest distance between the corner (5) and the third wall (6) is at most 800 nm, more preferably at most 500 nm, yet more preferably at most 300 nm. When this is the case, the diffusion length of the atoms during nucleation and ripening of the crystal (3) is typically longer than this distance. The shorter the distance, the more the previous sentence is true. Preferably in some embodiments, this distance at most equal to the length of the shortest of the first and second walls (4a, 4b) (or of any of both walls if they have the same length).

In various embodiments where there is a third wall (6), the length of the third wall (6) is at least equal to the length of the longest of the first wall (4a) and the second wall (4b) (or any of both walls if they have the same length).

As an example, the transition metal dichalcogenide has for formula $MX_2$ wherein M is a transition-metal atom (for example, Mo or W) and X is a chalcogen atom (for example, S, Se, or Te).

The template (1) is suitable for growing a crystal (3) of a two-dimensional material. The template (1) is also suitable for growing a crystalline layer of a two-dimensional material. This layer is typically monocrystalline. Hence, the template (1) is suitable for growing a monocrystal (3) of a two-dimensional material. The crystal (3) typically is a monolayer having a thickness of from 0.6 nm to 0.8 nm.

The length of the crystal of the two-dimensional material is only limited by the presence of obstacles to the growth of the crystal such as the edge of the substrate or the presence of a wall in the growth path. For instance, crystals of a two-dimensional material, the crystals having a length of from 5 nm to 5 μm or more, can be achieved.

For instance, the template (1) is suitable for growing an $MX_2$ crystal (3). The template (1) is also suitable for growing an $MX_2$ crystalline layer. This layer is typically monocrystalline. Hence, the template (1) is suitable for growing an $MX_2$ monocrystal (3). The crystal (3) typically is a monolayer having a thickness of from 0.6 nm to 0.8 nm.

In various implementations, the length of the $MX_2$ crystal is only limited by the presence of obstacles to the growth of the $MX_2$ crystal such as the edge of the substrate or the presence of a wall in the growth path. For instance, $MX_2$ crystals having a length of from 5 nm to 5 μm or more can be achieved.

The flat surface (2) can be the top surface of a crystalline substrate or of an amorphous substrate. The disclosed technology is particularly advantageous as it allows the growth of an $MX_2$ crystal (3) on a variety of substrate, including on amorphous substrates.

We now refer to FIG. 2A.

In embodiments where a third wall (6) is not present, the flat surface (2) for growing the transition metal dichalcogenide crystal (3) thereon may typically include a portion (2p) delimited either by: a) if each of the first and second walls (4b) reach an edge of a substrate including the flat surface (2) (situation not depicted): the first wall (4a), the second wall (4b), and the edges of the substrate; b) if at least one of the first and second walls (4b) do not reach an edge of a substrate including the flat surface (2) (situation depicted in FIG. 2A): the first wall (4a), the second wall (4b), extensions (7) of each of the first and second walls (4b) not reaching an edge of the substrate, and the edges of the substrate.

In embodiments, the walls may be of the same chemical nature as the flat surface (2). In other embodiments, the walls may be of a different chemical nature as the flat surface (2). In other words, the flat surface (2) and the walls may be made of different materials.

Preferably in some embodiments, the material of the walls can be etched selectively with respect to the material of the flat surface (2) and of the crystalline material, for example the $MX_2$ material. This allows obtaining a single $MX_2$ crystal (3) on a flat surface (2) without the presence of the walls. For example, the walls may be made of a graphene monolayer. Graphene can be selectively etched with a chloride- or sulphur-containing gas with respect to $MX_2$ materials and with respect to a $SiO_2$ or Si substrate. As another example, the walls may be made of silicon oxide and the substrate may be made of aluminum oxide. Silicon oxide can be etched selectively with respect to aluminum oxide and $MX_2$ by using HF as an etchant.

In certain embodiments, the walls may be made of a crystalline material having a lattice constant within one percent of the lattice constant of the two-dimensional crystal, for example the lattice constant of a transition metal dichalcogenide crystal (3) or for example $TiS_3$. In such embodiments, the flat surface (2) may be made of the same material as the walls or of a different material, for example, an amorphous material. The material of the flat surface (2) may have very little influence on the efficiency of the template (1). However, when the walls are made of a crystalline material having a lattice constant within one percent of the lattice constant of the transition metal dichalcogenide crystal (3), the growth of a monocrystalline layer, for example, the growth of a single crystal (3), in the template (1) can be favored in various implementations. Without being bound by theory, it is believed that by having a lattice constant close to that of the grown $MX_2$ material or $TiS_3$ material, more saturated covalent bonds can be formed between the nucleus perimeter and the walls, thereby increasing the orienting capability of the template (1).

In embodiments, the material of the walls may be made of one or more layers of a two-dimensional material. Examples of suitable materials are $SnS_2$, graphene, and hexagonal boron nitride (hBN).

In embodiments, preferably, each of the angles α, β, and γ may independently be selected in the range of from 55° to 65°, preferably 56° to 64°, more preferably 57° to 63°, yet more preferably from 58° to 62°, even more preferably from 59° to 61°, and is most preferably equal to 60°.

In other embodiments, preferably, the angle (α) may be selected from the range 85° to 95°, more preferably 86° to 94°, more preferably from 87° to 93°, yet more preferably from 88° to 92°, even more preferably from 89° to 91°, and is most preferably equal to 90° and each of the angles β, and γ may independently be selected in the range of from 40° to 50°, preferably 41° to 49°, more preferably 42° to 48°, yet more preferably from 43° to 47°, even more preferably from 44° to 46°, and is most preferably equal to 45°.

Figure 6:
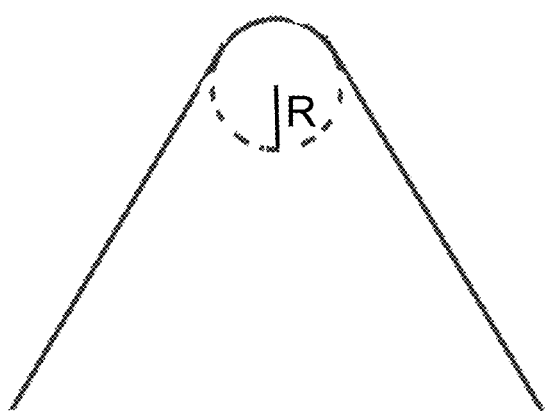
FIG. 6 illustrates the notion of radius of curvature.

We now refer to FIG. 6.

In embodiments, the corner (5) has a radius of curvature (R) of at most 5 nm, preferably at most 1 nm. The radius of curvature (R) can refer to a radius of a circle that best fits the surface of the corner (5). Ideally, in various embodiments, the surface of the corner (5) forms an infinitively sharp angle, for example, its radius of curvature (R) is 0 nm. In practice, however, the surface of the corner (5) may have a curvature (R). In various embodiments, this curvature (R) is preferably at most 5 nm and more preferably at most 1 nm.

In various embodiments, each of the first and second wall (4b) has a length of from 5 nm to 1000 nm, preferably from 5 nm to 800 nm, more preferably from 5 nm to 500 nm, yet more preferably from 5 nm to 300 nm.

Each of the first, second, and third wall (6) can have a height independently selected in the range of from 0.6 nm to 2 nm. In embodiments, the height of each wall (4a, 4b, 6) may independently be from 0.6 nm to 2.0 nm, preferably from 0.7 nm to 1.5 nm, more preferably from 0.8 nm to 1.2 nm.

Preferably, in some embodiments, all walls (4a, 4b, 6) have the same height. In some embodiments, this is advantageous because it is easier to manufacture and there are no advantages attached to the use of different heights for the different walls.

In embodiments, the template (1) may further include a transition metal dichalcogenide crystal (3) in physical contact with the flat surface (2), the first wall (4a), and the second wall (4b). In embodiments, the transition metal dichalcogenide crystal (3) may further be in contact with a third wall (6) if present.

Figure 7A:
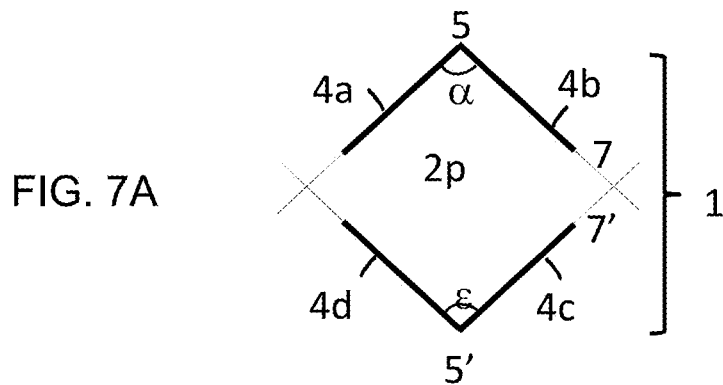
FIGS. 7A, 7B, and 7C are schematic representations of top views of templates according to embodiments of the first aspect of the disclosed technology.

We now refer to FIG. 7A.

In different embodiments, the template (1) includes a third wall (4c) and a fourth wall (4d) in physical contact with the flat surface, wherein the third and the fourth walls meet at a corner (5') to form an angle (E) having an opening that is adapted to align with the crystal structure of the crystal with a tolerance of up to 5°, the opening of the corner (5') facing the opening of the corner (5), that is, the corner of the first and second walls (4a, 4b), wherein the third wall (4c) is parallel to the first wall (4a), wherein the fourth wall (4d) is parallel to the second wall (4b), wherein the shortest distance between the first wall (4a) and the third wall (4c) and the shortest distance between the second wall (4b) and the fourth wall (4d) is at most 1000 nm, and wherein the length of the third wall (4c) and the length of the fourth wall (4d) respectively is at least equal to the length of the first wall and the length of the second wall respectively. In certain embodiments, the first, second, third and fourth walls of the template form an enclosure.

In embodiments, when the angle (α) between the first and the second walls (4a, 4b) has an opening from 85° to 95°, the third wall (4c) forms an angle (δ) of from 85° to 95° with the second wall (4b) or with an extensions (7) of the second wall (4b), and the fourth wall (4d) forms an angle (ζ) of from 85° to 95° with the first wall (4a) or with an extension (7) of the first wall (4a). The presence of the third and the fourth wall (4c, 4d) creates a complete or a partial enclosure. Within that enclosure, atoms are frequently within their diffusion length of the walls. It also permits to control the size of the crystal (3).

In embodiments, the first, second, third and fourth walls (4a, 4b, 4c, 4d) are physically connected and form a quadrilateral, for example a square, having corners (5, 5', 5", 5''') having respectively the angles (α, ε, δ, ζ) of opening from 85° to 95°, which are adapted to align with the crystal structure of the two-dimensional crystal. A portion (2p) of the flat surface (2) is entirely delimited by the first, second, third and third wall (4a, 4b, 4c, 4d). This portion (2p) forms an area within which atoms are frequently within their diffusion length of the walls, as represented in FIG. 8A. It also permits to control the size of the crystal (3). Furthermore, it provides three additional corners (5', 5", 5''') from which the two-dimensional crystal (3) can grow, enabling a faster growth. A disadvantage of the possibility of having more than one crystal (3) growing in the template (1) can be that these two-dimensional crystals (3) may overlap. In view of the orientation of such crystals (3), this typically only leads to defects that can be attenuated or erased by annealing.

FIGS. 8A, 8B, and 8C are schematic representations of top views of a template according to an embodiment of the first aspect. FIG. 8A shows the template before the formation of an $TiS_3$ nucleus. FIG. 8B shows a $TiS_3$ growing in a corner (5'). FIG. 8C shows the same $TiS_3$ nucleus after it has grown to almost its final size. FIG. 8D shows the schematic representation of a side view of a cut through the dashed line in FIG. 8B.

The presence of the third and the fourth walls (4c, 4d) can be particularly advantageous when the template (1) includes in addition to a series of the first walls (4a) parallel to each other and a series of the second walls (4b) parallel to each other, also a series of third walls (4c) parallel to each other and a series of fourth walls (4d) parallel to each other.

Figure 7B:
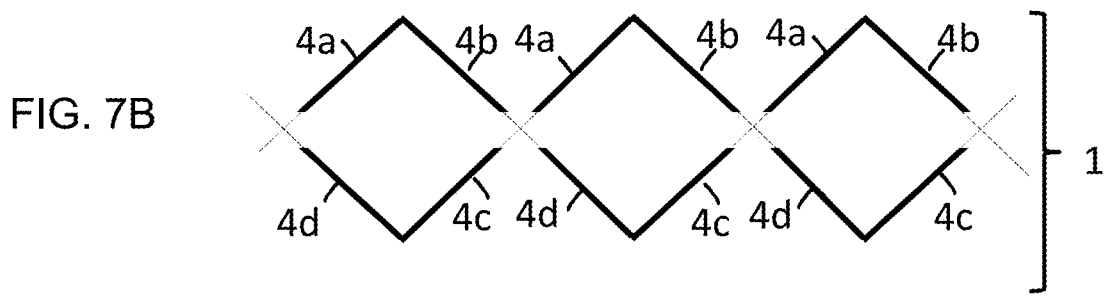

In embodiments, the template (1) may include four series of walls, that is, a series of the first walls (4a) parallel to each other, a series of the second walls (4b) parallel to each other, a series of third walls (4c) parallel to each other and a series of fourth walls (4d) parallel to each other. Such embodiments with four series have the advantage of providing a plurality of corners (5) and (5') facing each other, from which crystals can grow. This situation is depicted in FIG. 7B. A disadvantage of the possibility of having more than one corners (5) and (5') and hence more than one crystal (3) growing in the template (1) is that some of these crystals (3) may overlap with each other. In view of the typical orientation of such crystals (3), this typically only leads to defects that can be attenuated or erased by annealing.

Figure 7C:
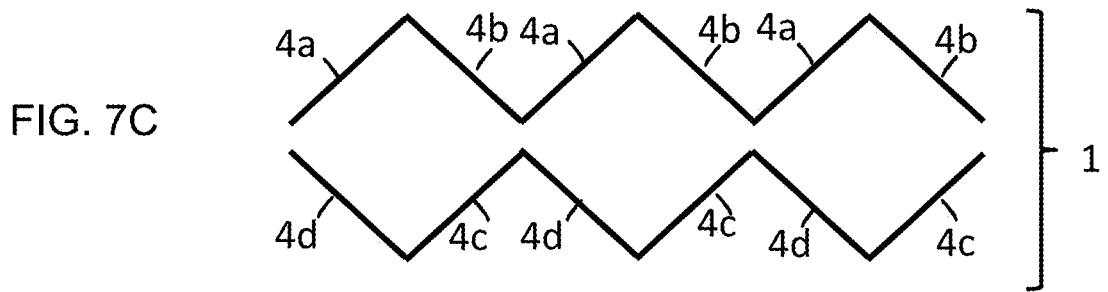

In embodiments, the four series of walls may form a first chain of first walls (4a) alternating with second walls (4b) and a second chain of third walls (4c) alternating with fourth walls (4d). This situation is depicted in FIG. 7C.

As we have seen in relation to FIG. 7B, a disadvantage of having the four series of walls (4a, 4b, 4c, 4d) parallel to each other is that some of the crystals (3) growing in such a template (1) may overlap with each other. To avoid this, the second chain of third walls (4c) alternating with fourth walls (4d) can be physically connected to all first walls (4a) and all second walls (4b) of the chain, thereby forming squares. This prevents crystals (3) of the chain formed of squares from overlapping with each other.

We now refer to FIG. 7A.

In embodiments, the shortest distance between the corner (5) and the corner (5') is larger than the sum of the height (h) of a triangle formed on the flat surface (2) by the corner (5), an extremity of the first wall (4a) away from the corner (5), and an extremity of the second wall (4b) away from the corner (5), and the height (h') of a triangle formed on the flat surface (2) by the corner (5'), an extremity of the third wall (4c) away from the corner (5') and an extremity of the fourth wall (4d) away from the corner (5'). In such embodiments, a portion (2p) of the flat surface (2) is partly delimited by the first and second walls (4a, 4b) and by the third and fourth walls (4c, 4d). It is further delimited by extensions (7) of each of the first and second wall (4b) and extensions (7') of each of the third and the fourth wall. In such embodiments, a portion (2p) of the flat surface (2) is entirely delimited by the first, second, third and fourth wall (4a, 4b, 4c, 4d), and their extensions (7, 7'). The extensions (7, 7') are not solid objects but are virtual. In other words, an extension (7, 7') of a wall (4a, 4b, 4c, 4d) is a part of space that would be occupied by the wall (4a, 4b, 4c, 4d) if the wall (4a, 4b, 4c, 4d) was longer than it is.

In all embodiments where third and fourth walls (4c, 4d) are present, the shortest distance between the corner (5) and the corner (5') is preferably at most 1000 nm. When this is the case, the diffusion length of the atoms during the nucleation and ripening of the crystal (3) can typically be made longer than this distance. This ensures that, typically, only one crystal (3) will grow in the space delimited by the three walls and the extensions (7) of the first and second walls (4b).

In some embodiments, preferably, the shortest distance between the corner (5) and the corner (5') is at most 800 nm, more preferably at most 500 nm, yet more preferably at most 300 nm. When this is the case, the diffusion length of the atoms during nucleation and ripening of the crystal (3) is typically longer than this distance. The shorter the distance, the more the previous sentence is true.

We now refer to FIGS. 5A-5F.

In a second aspect, the disclosed technology relates to a method of forming a template (1) according to the first aspect, including:

a. providing a layer stack including:
   i. a flat surface (2) for growing a crystal (3) of a two-dimensional material thereon,
   ii. a wall material layer (11) on the flat surface (2),
   iii. a hard mask layer (8) over (for example, on) the wall material layer (11),
   iv. a first set of parallel lines (9) separated by a distance of from 5 nm to 1000 nm, the first set being above (for example, on) a top surface of the hard mask layer (8), being parallel thereto, and having a first orientation, and
   v. a second set of parallel lines (10) separated by a distance of from 5 nm to 1000 nm, the second set being above the top surface of the hard mask layer (8), being parallel thereto, and having a second orientation forming an angle ($\alpha$) with the first orientation that is adapted to align with the crystal structure of the crystal with a tolerance of up to 5°,
b. etching the hard mask layer (8) anisotropically and perpendicularly to the top surface of the hard mask layer (8) by using the first and the second set of parallel lines (9, 10) as masks, thereby forming a hard mask pattern, and
c. etching the wall material layer (11) anisotropically and perpendicularly to the top surface of the wall material layer (11) by using the hard mask pattern as a mask, thereby forming the walls (4a, 4b).

As an example, when the angle ($\alpha$) has an opening from 55° to 65°, the method is suitable for forming a template (1) for growing a transition metal dichalcogenide crystal.

As another example, when the angle ($\alpha$) has an opening from 85° to 95°, the method is suitable for forming a template (1) for growing, for example, $TiS_3$.

In embodiments, the lines of the first set of parallel lines can be equidistant. In embodiments, the lines of the second set of parallel lines can be equidistant.

In embodiments, the first and the second set of parallel lines (9, 10) can be separated by a capping layer (for example, made of silicon nitride) (12).

In embodiments, the first and second set of parallel lines (9, 10) can be made of silicon oxide.

In embodiments, providing a layer stack may include:
a1) providing a substrate (for example, a Si substrate),
a2) proving a dielectric layer (for example, an amorphous dielectric material) on the substrate, wherein the dielectric layer has a top flat surface (2) for growing a transition metal dichalcogenide crystal (3),
a3) providing a wall material layer (11) on the dielectric layer,
a4) providing a hard mask layer (8) on the wall material layer (11),
a5) forming an overlayer (for example, in silicon oxide) on the hard mask layer (8),
a6) patterning the overlayer so as to form a first set of parallel lines (9) (for example, in silicon oxide) separated by a distance of from 5 nm to 1000 nm on the hard mask layer (8),
a7) forming a capping layer (12) (for example, in silicon nitride) conformally on the first set of parallel lines (9), a8) forming a filling layer (for example, in silicon oxide) on the capping layer so as to fill the gaps between the lines of the first set and so as to obtain a flat top surface for the filling layer, and a9) patterning the filling layer so as to form the second set of parallel lines (10) separated by a distance of from 5 nm to 1000 nm, on the capping layer, above the top surface of the hard mask layer (8), being parallel to the top surface of the hard mask layer (8) and having a second orientation forming an angle ($\alpha$) of from 55 to 65° with the first orientation.

In embodiments, the method may further include, between etching the hard mask layer and etching the wall material layer, removing part of the hard mask pattern, thereby enlarging the flat surface (2) of the template (1) obtained after etching the wall material layer. In embodiments, this removal of part of the hard mask pattern can be performed by etching.

In embodiments, the angle ($\alpha$) is preferably from 56° to 64°, more preferably from 57° to 63°, yet more preferably from 58° to 62°, even more preferably from 59° to 61°, and is most preferably equal to 60°.

In other embodiments, the angle ($\alpha$) is preferably from 86° to 94°, more preferably from 87° to 93°, yet more preferably from 88° to 92°, even more preferably from 89° to 91°, and is most preferably equal to 90°.

In embodiments, the first set of parallel lines (9) may be separated by a distance equal to the length of the first walls one wishes to obtain. For instance, the first set of parallel lines (9) may be separated by a distance of from 5 nm to 800 nm, from 5 nm to 500 nm, or from 5 nm to 300 nm.

In embodiments, the second set of parallel lines (10) may be separated by a distance equal to the length of the second walls one wishes to obtain. For instance, the second set of parallel lines (10) may be separated by a distance of from 5 nm to 800 nm, from 5 nm to 500 nm, or from 5 nm to 300 nm.

In embodiments, the first set of parallel lines (9) may be separated by a distance equal to the distance separating the second set of parallel lines (10).

Any feature of any embodiment of the second aspect can be as correspondingly described in any embodiment of the first aspect.

In a third aspect, the disclosed technology relates to a process of growing a layer of the crystalline material, for example an $MX_2$ material or for example $TiS_3$ including a) providing a template (1) according to any embodiment of the first aspect, and b) growing the layer of the crystalline material for example $MX_2$ material or for example $TiS_3$ within the template (1).

In embodiments, growing the $MX_2$ material within the template may be performed by chemical vapor deposition (CVD). For instance, growing the $MX_2$ material within the template can be performed by CVD from a metal-organic or metal-halide (for example, $W(CO)_6$, $WCl_6$) and from a sulphur precursor (for example, $H_2S$, elemental S). CVD can be advantageous as it allows tuning of the diffusion length in the range of from 10 nm to beyond 1000 nm in some implementations. As another example, growing the $MX_2$ material can be performed by CVD from a metal organic or metal halide (for example, $TiCl_5$).

In embodiments, growing the $MX_2$ material within the template may be performed by an atomic layer deposition process (ALD). ALD can be particularly advantageous in some instances, for example, when each of the first and second walls (4a, 4b) has a length of from 5 nm to 50 nm.

In a fourth aspect, the disclosed technology relates to the use of a template according to the first aspect to grow a crystal, for example $MX_2$ material or for example $TiS_3$.

Any feature of any embodiment of the fourth aspect can be as correspondingly described in any embodiment of the first aspect or in the third aspect.

Any feature of any embodiment of the third aspect can be as correspondingly described in any embodiment of the first or second aspect.

It is to be understood that although certain embodiments, specific constructions and configurations, as well as materials, have been discussed herein for devices according to the disclosed technology, various changes or modifications in form and detail may be made without departing from the scope of the disclosed technology. For example, any formulas given above are merely representative of procedures that may be used. Functionality may be added or deleted from the block diagrams and operations may be interchanged among functional blocks. Steps may be added or deleted to methods described within the scope of the disclosed technology.

What is claimed is:

1. A template for growing a crystal of a two-dimensional material, comprising:
    a flat surface for growing the crystal of the two-dimensional material thereon;
    a first wall on the flat surface; and
    a second wall on the flat surface,
    wherein the first and the second walls meet at a corner to form an angle ($\alpha$) having an opening that is adapted to align with the crystal structure of the crystal with a tolerance of up to 5°, wherein each of the first and second walls has a length of from 5 nm to 1000 nm and a height of from 0.6 nm to 2 nm.

2. The template according to claim 1, further comprising a third wall on the flat surface, the third wall facing the opening and forming an angle ($\beta$, $\gamma$) with each of the first and second walls or with extensions of each of the first and second walls.

3. The template according to claim 2, wherein the shortest distance between the corner and the third wall is at most 1000 nm, wherein the length of the third wall is at least equal to the length of the longest of the first wall and the second wall, and wherein the height of the third wall is from 0.6 nm to 2 nm.

4. The template according to claim 2, wherein each of the angles ($\beta$, $\gamma$) is from 55° to 66°.

5. The template according to claim 4, wherein each of the angles ($\beta$, $\gamma$) is from 59 to 61°.

6. The template according to claim 5, wherein each of the angles ($\beta$, $\gamma$) is equal to 60°.

7. The template according to claim 1, wherein the angle ($\alpha$) is from 85° to 95°.

8. The template according to claim 7, wherein the angle ($\alpha$) is equal to 90°.

9. The template according to claim 2, wherein the angle ($\alpha$) is from 85° to 95°, and wherein each of the angles ($\beta$, $\gamma$) is from 42° to 48°.

10. The template according to claim 9, wherein each of the angles ($\beta$, $\gamma$) is from 44° to 46°.

11. The template according to claim 10, wherein each of the angles ($\beta$, $\gamma$) is equal to 45°.

12. The template according to claim 2, wherein the first, second, and third walls form a triangle.

13. The template according to claim 1, comprising a series of the first walls parallel to each other and a series of the second walls parallel to each other.

14. The template according to claim 1, further comprising a third wall, and a fourth wall on the flat surface, wherein the third and the fourth walls meet at a further corner to form an angle ($\epsilon$) having an opening that is adapted to align with the crystal structure of the crystal with a tolerance of up to 5°, wherein the opening of the further corner faces the opening of the corner, wherein the third wall is parallel to the first wall, wherein the fourth wall is parallel to the second wall, wherein the shortest distance between the first wall and the third wall and the shortest distance between the second wall and the fourth wall is at most 1000 nm, and wherein the length of the third wall and the length of the fourth wall is equal to the length of the first wall and the length of the second wall respectively.

15. The template according to claim 14, comprising a series of first walls parallel to each other, a series of the second walls parallel to each other, a series of third walls parallel to each other, and a series of fourth walls parallel to each other.

16. The template according to claim 14, wherein the first, second, third, and fourth walls from a square.

17. The template according to claim 1, wherein the flat surface is amorphous.

18. The template according to claim 1, wherein the height of each wall is from 1 nm to 2 nm.

19. The template according to claim 1, wherein the walls are made of a crystalline material having a lattice constant within one percent of the lattice constant of the crystal of two-dimensional material.

20. The template according to claim 1, wherein the material of the walls can be etched selectively with respect to the material of the flat surface.

21. A method of forming a template, comprising:
a. providing a layer stack comprising:
   i. a flat surface for growing a crystal of a two-dimensional material thereon,
   ii. a wall material layer on the flat surface,
   iii. a hard mask layer over the wall material layer,
   iv. a first set of parallel lines separated by a distance of from 5 nm to 1000 nm, the first set being above a top surface of the hard mask layer, being parallel thereto, and having a first orientation, and
   v. a second set of parallel lines separated by a distance of from 5 nm to 1000 nm, the second set being above the top surface of the hard mask layer, being parallel thereto, and having a second orientation forming an angle ($\alpha$) with the first orientation that is adapted to align with the crystal structure of the two-dimensional material crystal with a tolerance of up to 5°;
b. etching the hard mask layer anisotropically and perpendicularly to the top surface of the hard mask layer by using the first and the second set of parallel lines as masks, thereby forming a hard mask pattern; and
c. etching the wall material layer anisotropically and perpendicularly to the top surface of the wall material layer by using the hard mask pattern as a mask, thereby forming the template.

22. A method of growing a crystal of a two-dimensional material, the method comprising providing the template according to claim 1, and growing the crystal of the two-dimensional material within the template.

* * * * *

UNITED STATES PATENT AND TRADEMARK OFFICE
CERTIFICATE OF CORRECTION

PATENT NO. : 12,428,749 B2
APPLICATION NO. : 18/351402
DATED : September 30, 2025
INVENTOR(S) : Yuanyuan Shi et al.

It is certified that error appears in the above-identified patent and that said Letters Patent is hereby corrected as shown below:

In the Specification

Column 2, Lines 50-51, delete "to 650 with" and insert -- to 65° with --.

Column 2, Line 65, delete "from 550 to 650 or" and insert -- from 55° to 65° or --.

Column 2, Line 65, delete "to 950." and insert -- to 95°. --.

Column 3, Lines 6-7, delete "angle (e) having" and insert -- angle (ε) having --.

Column 3, Line 26, delete "from 550 to 650 or" and insert -- from 55° to 65° or --.

Column 3, Line 28, delete "to 950 is" and insert -- to 95° is --.

Column 3, Line 35, delete "angle (e), the" and insert -- angle (ε), the --.

Column 3, Lines 38-39, delete "from 550 to 650 or" and insert -- from 55° to 65° or --.

Column 3, Line 42, delete "from 550 to 650 or" and insert -- from 55° to 65° or --.

Column 3, Line 42, delete "to 950." and insert -- to 95°. --.

Column 3, Lines 54-55, delete "from 550 to 650 or" and insert -- from 55° to 65° or --.

Column 4, Line 47, delete "from 550 to 650 with" and insert -- from 55° to 65° with --.

Column 9, Line 47, delete "to 10, most" and insert -- to 1°, most --.

Signed and Sealed this
Twenty-third Day of December, 2025

John A. Squires
*Director of the United States Patent and Trademark Office*

Column 10, Line 27, delete "from 550 to 650 with" and insert -- from 55° to 65° with --.

Column 10, Lines 37-38, delete "from 400 to 500 with" and insert -- from 40° to 50° with --.

Column 14, Line 15 (approx.), delete "angle (E) having" and insert -- angle (ε) having --.